(12) United States Patent
Santi

(10) Patent No.: US 9,950,717 B2
(45) Date of Patent: Apr. 24, 2018

(54) PERIPHERAL CONTROL POST OF RAILWAY FIELD DEVICES AND INSTALLATION METHOD OF SAID PERIPHERAL POST

(71) Applicant: ECM S.p.A., Serravalle Pistoiese (IT)

(72) Inventor: Alessandro Santi, Serravalle Pistoiese (IT)

(73) Assignee: ECM S.p.A., Serravalle Pistoiese (Pistoia) (IT)

(*) Notice: Subject to any disclaimer, the term of this patent is extended or adjusted under 35 U.S.C. 154(b) by 0 days.

(21) Appl. No.: 15/026,902

(22) PCT Filed: Sep. 19, 2014

(86) PCT No.: PCT/IT2014/000252
§ 371 (c)(1),
(2) Date: Apr. 1, 2016

(87) PCT Pub. No.: WO2015/049707
PCT Pub. Date: Apr. 9, 2015

(65) Prior Publication Data
US 2016/0264161 A1    Sep. 15, 2016

(30) Foreign Application Priority Data
Oct. 4, 2013   (IT) ............................. RM2013A0540

(51) Int. Cl.
*H05K 5/00*  (2006.01)
*B61L 7/08*  (2006.01)
(Continued)

(52) U.S. Cl.
CPC ...... *B61L 7/08* (2013.01); *B61L 7/06* (2013.01); *B61L 19/06* (2013.01); *B61L 19/16* (2013.01);
(Continued)

(58) Field of Classification Search
CPC ...... H05K 7/14; H05K 7/1452; H05K 7/1457; H05K 7/1466; H05K 7/1467;
(Continued)

(56) References Cited

U.S. PATENT DOCUMENTS 4,179,172 A * 12/1979 Godsey ............... H05K 7/1439
                                                    361/785
5,430,615 A *  7/1995 Keeth ................. H01R 12/7082
                                                    361/784
(Continued)

*Primary Examiner* — Hung S Bui
(74) *Attorney, Agent, or Firm* — Arent Fox LLP

(57) ABSTRACT

There is described a peripheral post of railway field devices, comprising: a plurality of control modules operatively connected or connectable by electric cables to respective railway field devices; —a rack housing said plurality of control modules, wherein said rack comprises: —a wiring frame adapted to be permanently attached to a support surface or to an installation wall, comprising a front side and an opposite rear side and comprising on the rear side first connectors adapted to be electrically connected to end portions of said cables; —a support and containment frame of the modules adapted to house said modules and adapted to be coupled to the wiring frame by drawing said support and containment frame near the wiring frame from said front side so as to reach a coupling position.

14 Claims, 7 Drawing Sheets

(51) Int. Cl.
  *H05K 7/14* (2006.01)
  *B61L 19/06* (2006.01)
  *B61L 19/16* (2006.01)
  *B61L 7/06* (2006.01)
  *H05K 7/18* (2006.01)
  *H05K 13/00* (2006.01)
  *B61L 23/08* (2006.01)
  *B61L 29/00* (2006.01)

(52) U.S. Cl.
  CPC ............. *H05K 7/14* (2013.01); *H05K 7/1452* (2013.01); *H05K 7/1457* (2013.01); *H05K 7/1465* (2013.01); *H05K 7/1467* (2013.01); *H05K 7/1474* (2013.01); *H05K 7/18* (2013.01); *H05K 13/0023* (2013.01); *B61L 23/08* (2013.01); *B61L 29/00* (2013.01)

(58) Field of Classification Search
  CPC ...... H05K 7/1465; H05K 7/1474; H05K 7/18; B61L 7/08; B61L 7/06; B61L 19/06; B61L 19/16; B61L 23/08; B61L 29/00
  USPC ................. 361/728–730, 737, 756
  See application file for complete search history.

(56) References Cited

U.S. PATENT DOCUMENTS

| | | | |
|---|---|---|---|
| 5,867,369 A * | 2/1999 | Antonuccio | G06F 1/184 312/223.2 |
| 6,220,679 B1 * | 4/2001 | Chen | G06F 1/181 312/223.2 |
| 6,987,673 B1 * | 1/2006 | French | H05K 7/20718 312/223.2 |
| 7,079,778 B1 * | 7/2006 | Nelson | H04B 10/802 398/128 |
| 7,164,581 B2 * | 1/2007 | Carullo | H05K 7/1451 361/679.48 |
| 7,924,570 B2 * | 4/2011 | Randall | H05K 7/1492 174/54 |
| 9,295,169 B1 * | 3/2016 | Spinner | G01R 31/31907 |
| 2002/0006026 A1 * | 1/2002 | Takahashi | H05K 7/1418 361/679.46 |
| 2005/0074222 A1 | 4/2005 | Mitsuaki et al. | |
| 2007/0293065 A1 | 12/2007 | Yoshiyuki et al. | |
| 2011/0188815 A1 * | 8/2011 | Blackwell, Jr. | H05K 1/11 385/88 |
| 2015/0029675 A1 * | 1/2015 | Rossman | H05K 7/1447 361/726 |

* cited by examiner

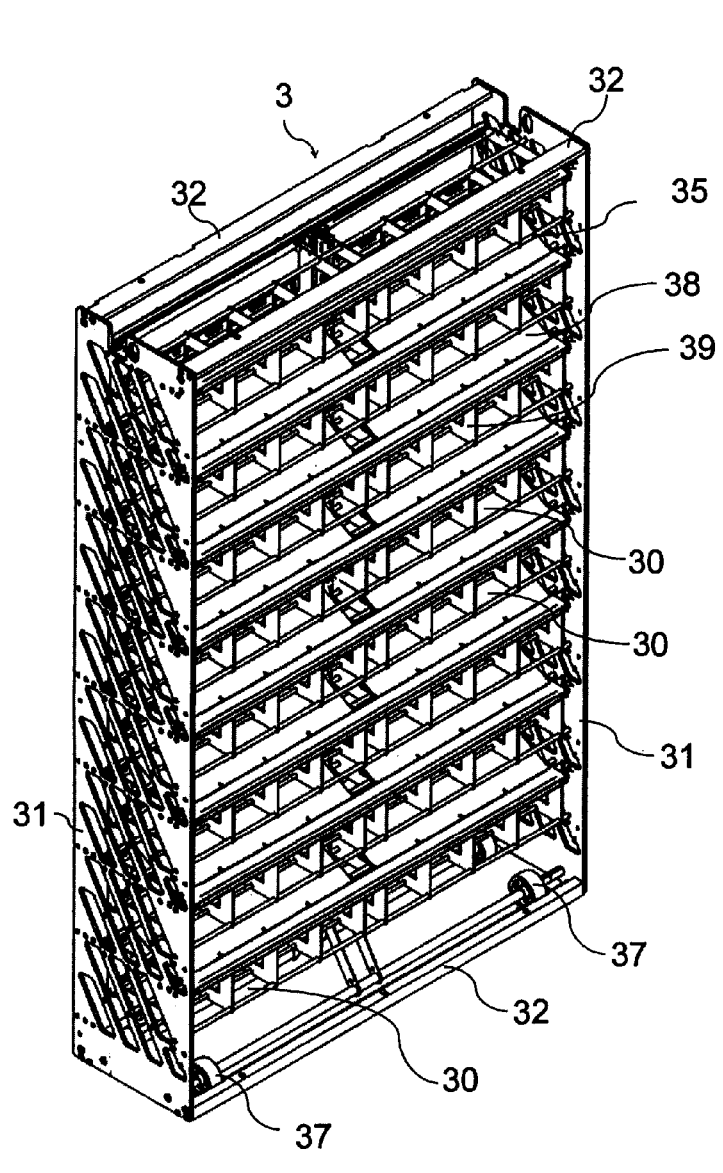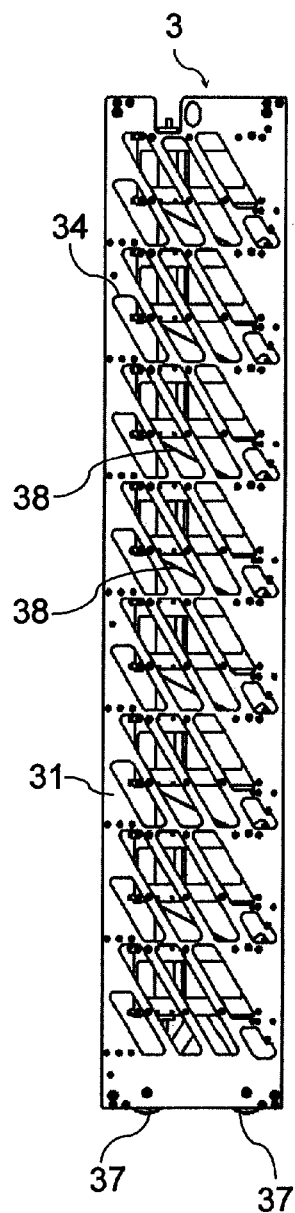
FIG. 5
FIG. 6

PERIPHERAL CONTROL POST OF RAILWAY FIELD DEVICES AND INSTALLATION METHOD OF SAID PERIPHERAL POST

FIELD OF TECHNOLOGY

The present description relates to the technical field of control systems of a railway line and more particularly it relates to a peripheral control post of railway field devices.

BACKGROUND

Railway interlocking and/or signalling systems are known, comprising a central control post and a one or more peripheral posts operatively connected to the central control post. The peripheral control posts are operatively connected, for example by means of electrical cables, to a plurality of railway field devices, such as: signalling devices, level crossings, switch blocks, switch points, axles counters, etc. In particular, control modules are provided in the peripheral control posts, each connected to one or more respective field devices. Said control modules are normally housed in dedicated racks. The system architecture is often modular, meaning that each rack can accommodate a plurality of control modules that can be removed or added independently of each other, on the basis of the needs related to the number of field devices to be controlled and based on needs related to maintenance and/or scaling of the system.

To install a peripheral control post, such as in a dedicated room, the field devices must be wired to the respective control modules.

The operations of installation and wiring of the peripheral control posts of the prior art are particularly complex. Such operations generally are the following: installing empty racks, laying electrical connection cables from the field devices to the place of installation of the peripheral post, populating of the racks with control modules, connecting the electrical wires coming from the field devices to the various control modules, full system testing aimed at testing the peripheral post, at the place of installation.

SUMMARY

A general object of the present description is to provide a peripheral control post of railway field devices which is capable of solving or minimising the drawbacks mentioned above with reference to the prior art.

This and other objects are achieved by a peripheral control post of railway field devices as defined in claim 1 in the most general form thereof and in the dependent claims in some particular embodiments thereof.

Another object of the present invention is an installation method of a peripheral control post of railway field devices as defined in claim 14.

BRIEF DESCRIPTION OF THE DRAWINGS

The invention will be better understood from the following detailed description of embodiments thereof, made by way of an example and therefore in no way limiting with reference to the accompanying drawings, in which:

FIG. 5 shows a perspective view from the front side of the support and containment frame of FIG. 1;

FIG. 6 shows a lateral plan view of the support and containment frame of FIG. 1;

DETAILED DESCRIPTION

Figure 1:
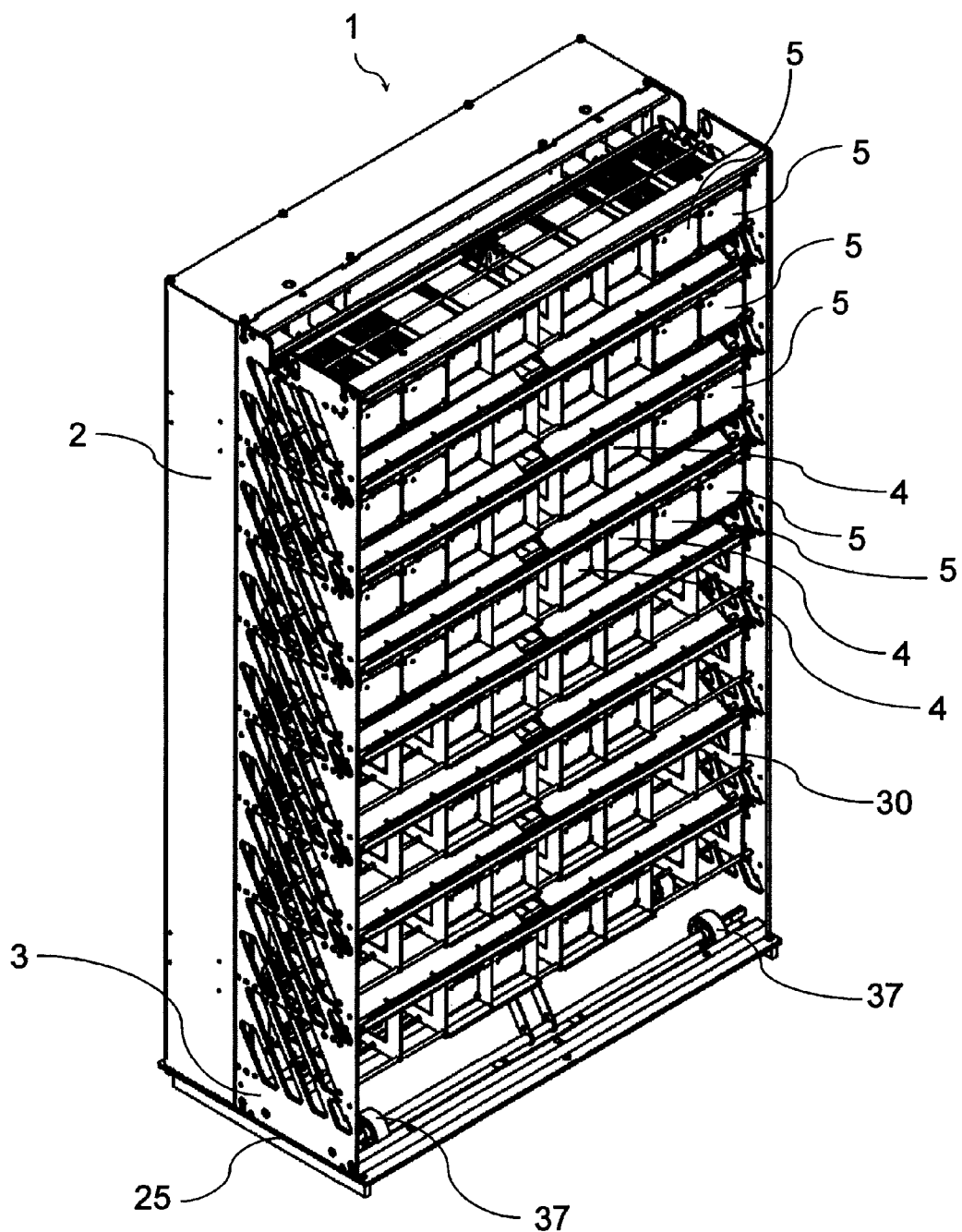
FIG. 1 shows a perspective view from the front side of a peripheral control post comprising a rack housing a plurality of control modules of railway field devices, wherein the rack includes a wiring frame and a support and containment frame of the control modules.

In the accompanying figures, elements which are equivalent or similar will be indicated by the same reference numerals.

FIG. 1 shows a peripheral control post 1 including a rack 2, 3 housing a plurality of control modules 4, 5 of railway field devices. Based on the number of railway field devices to be controlled, it is clear that the peripheral control post 1 may include more racks 2, 3 of the type shown in FIG. 1. The peripheral control post 1 in FIG. 1 is for example comprised within a railway signalling and/or interlocking system comprising a central control post and a plurality of peripheral control posts 1, wherein the central post is operatively connected to the peripheral posts 1 and the peripheral posts 1 are operatively connected to the railway field devices. The central post is such as to send the railway logic control signals to the peripheral posts 1 and is such as to receive signals from the peripheral posts containing information about the status of the field devices controlled.

The central post is connected to the peripheral control posts 1 by a suitable telecommunications network, such as optical fibre, for example based on an Ethernet protocol.

The railway signalling and/or interlocking system is intended to control one or more railway lines, where for the purposes of this description, "railway line" means any line, comprising one or more tracks, either underground or surface or mixed, either urban and suburban, including a metro line.

Figure 10:
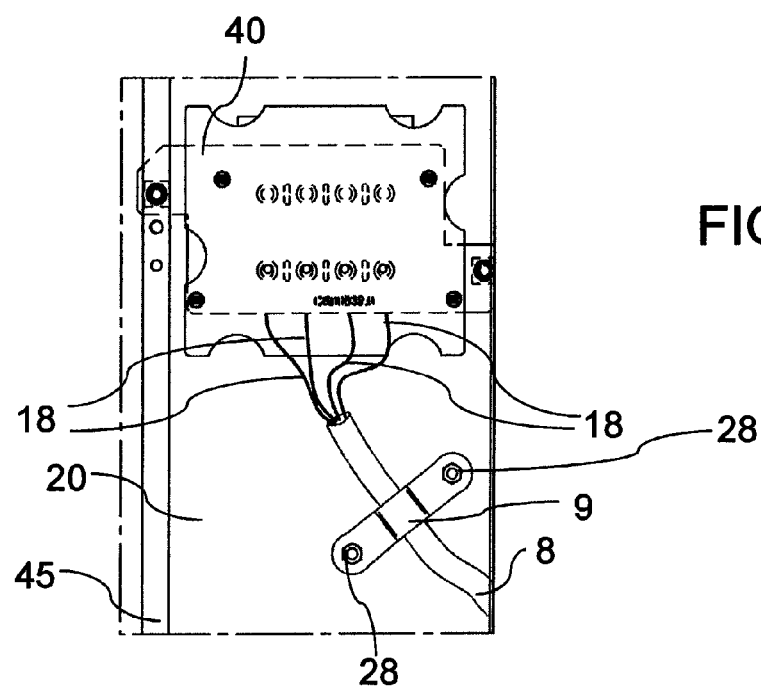
FIG. 10 shows an example of interconnection device adapted to connect the first and the second connector of FIG. 9 to each other.

The control modules 4, 5 are operationally connected or connectable, e.g. by means of electrical cables 8 (one of which is shown in FIG. 10), to a plurality of railway field devices (not shown in the figures), such as: signalling devices, level crossings, switch blocks, switch point, axles counters, etc. to send to said devices control and/or supply signals and preferably to receive incoming status signals from the controlled devices.

Rack 2, 3 comprises a wiring frame 2 adapted to be permanently attached to a support surface or to an installation wall, comprising a front side 6 and an opposite rear side 7 and comprising on the rear side first connectors 11 adapted to be electrically connected to end portions of cables 8 (one of which is visible in FIG. 10) coming from the railway field devices.

With reference to FIG. 1, rack 2, 3 also includes a support and containment frame 3 of the control modules 4, 5 adapted to accommodate and support said modules 4, 5 and couplable to the wiring frame 2 by drawing the support and containment frame 3 near the wiring frame 2 from the front side 6 of the wiring frame 2 until reaching a coupling position. Preferably, according to the example shown in the figures, the support and containment frame 3 is a rack structure adapted to contain and support inside seats 30 the control modules 4, 5.

Figure 2:
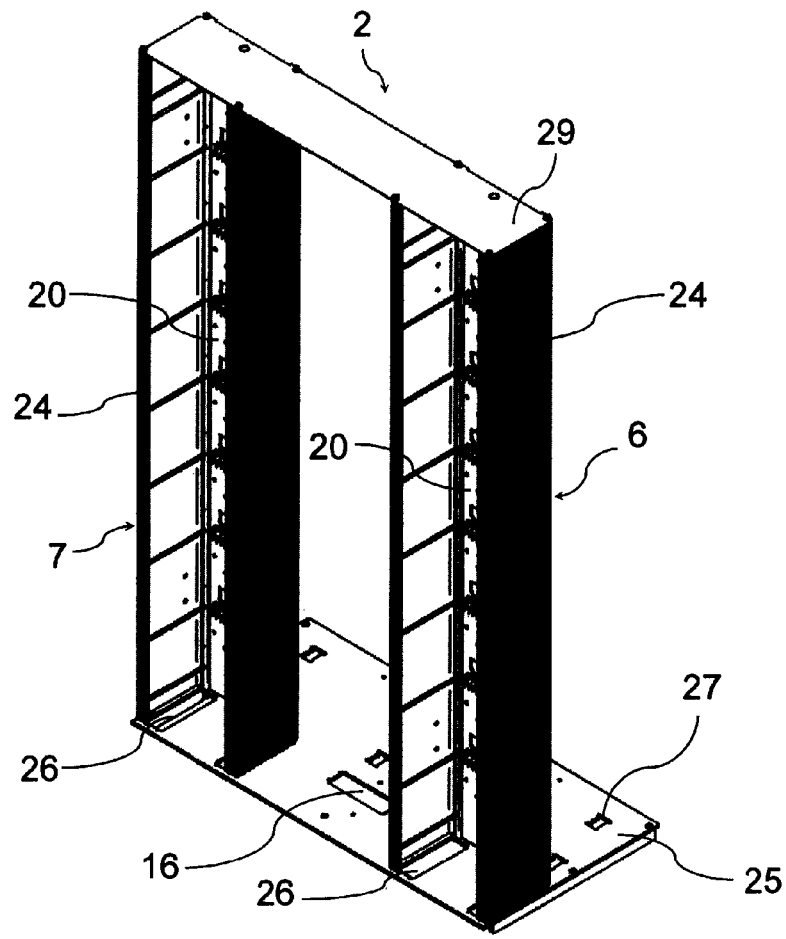
FIG. 2 shows a perspective view from the rear side of the wiring frame of FIG. 1.
Figure 3:
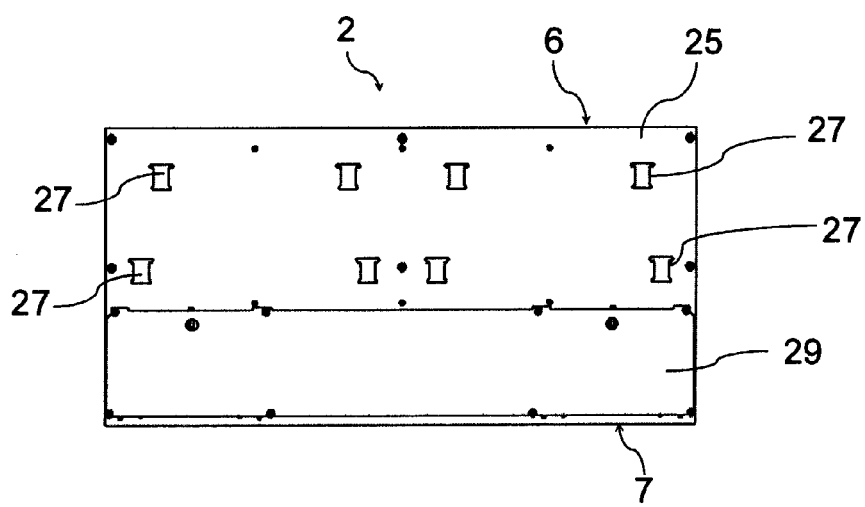
FIG. 3 shows a top plan view of the wiring frame of FIG. 1.
Figure 4:
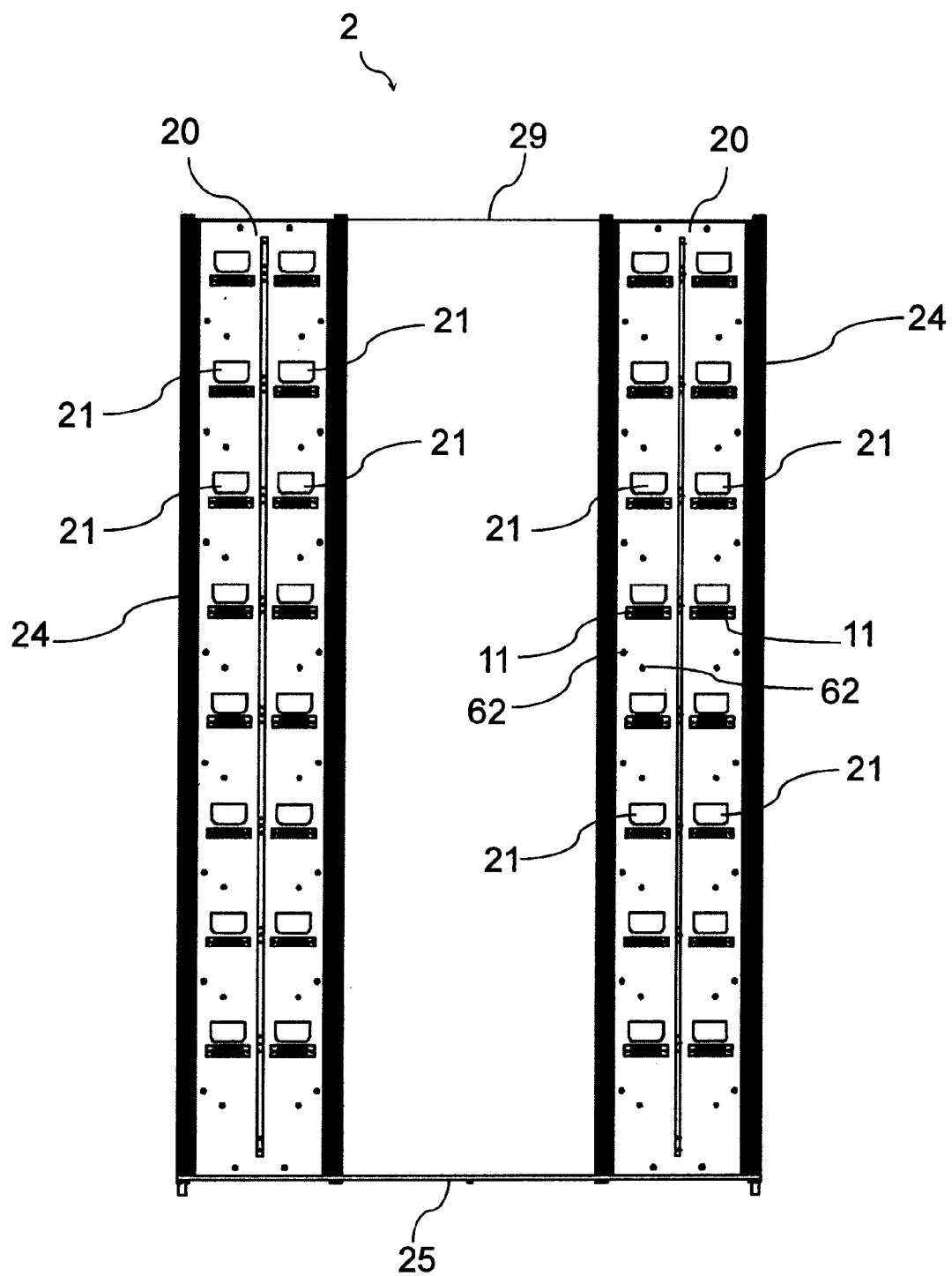
FIG. 4 shows a rear plan view of the wiring frame of FIG. 1.

With reference to FIGS. 2 and 3, according to an embodiment, the wiring frame 2 comprises at least one upright 24 and a base 25 to which upright 24 is attached and which projects in relation to said upright from the front side 6 of the wiring frame 2. According to an embodiment, said upright 24 has a cross section generally U- or C-shaped. Preferably, said base 25 is plate-shaped and allows the attachment of the wiring frame 2 to a floating floor. In the particular example shown, the wiring frame 2 is provided with two uprights 24 connected at the top by a plate-shaped crosspiece 24.

In the coupling position between the wiring frame 2 and the support and containment frame 3, the support and containment frame 3 is superposed on base 25. Preferably, base 25 comprises stop elements 27 adapted to define said coupling position. For example, according to an embodiment, the support and containment frame 3 of the control modules 4, 5 is provided underneath with a plurality of wheels 37, for example four wheels 37, preferably made of Teflon. In such an embodiment, said stop elements 27 of base 25 include recesses 27 adapted to receive at least partially wheels 37, so that drawing the support and containment frame 3 near the wiring frame 2, said wheels superpose to base 25 and it is possible to draw the two frames 4, 5 near each other until wheels 37 enter into the respective recesses 27.

According to an embodiment, base 25 is provided with one or more through openings 26 provided for the passage of the connection cables 8 to the railway field devices.

The support and containment frame 3 includes a plurality of seats 30 inside which the control modules 4, 5 are, or may be, engaged, and thus accommodated. Such seats 30 are seats supporting the control modules 4, 5. Preferably, seats 30 form an array of seats arranged over multiple rows, such as eight rows as in the case of the support and containment frame 3 shown in the accompanying figures.

Preferably, the support and containment frame 3 includes two lateral vertical plates 31 held together by crosspieces 32. Preferably, the lateral vertical plates 31 have a plurality of openings 34 and are made of metal, for example aluminium. Preferably, a plurality of rods 35 extend between the vertical plates 31 for each row of seats 30, which vertically delimit seats 30 and on which the control modules 4, 5 rest. Preferably, in order to horizontally delimit seats 30, intermediate vertical plates 30 are provided crossed by rods 35. Preferably, between two consecutive rows of seats 30, the support and containment frame 3 comprises at least one inclined panel 38, for example metal, which serves for conveying towards the rear face of the support and containment frame 3 the heat produced in operation by the control modules 4, 5.

Figure 7:
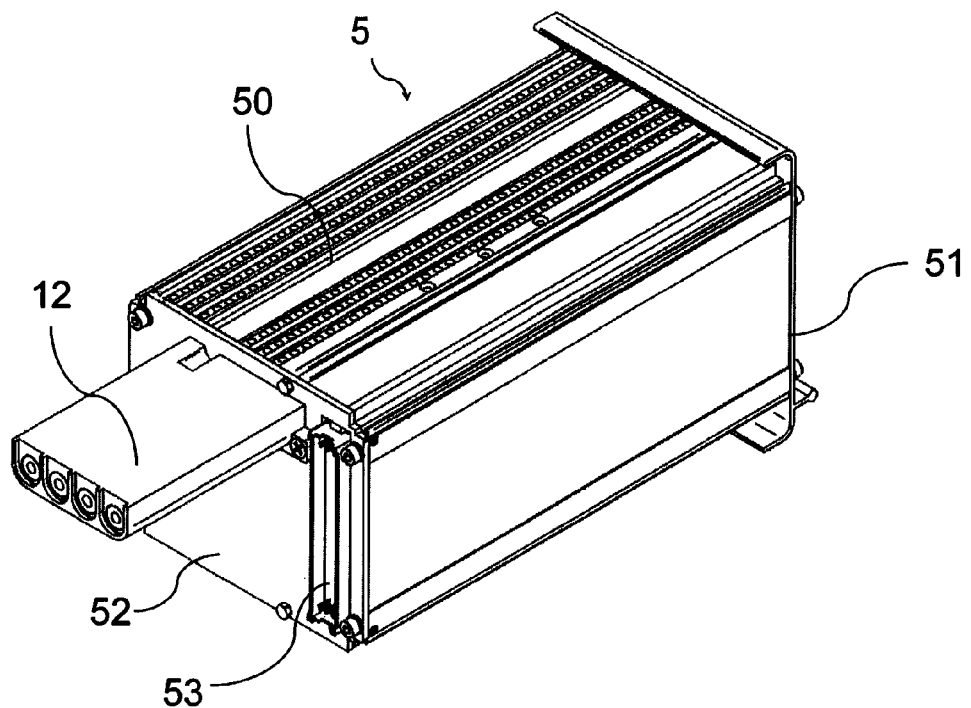
FIG. 7 shows a perspective view from the rear side of a control module.
Figure 8:
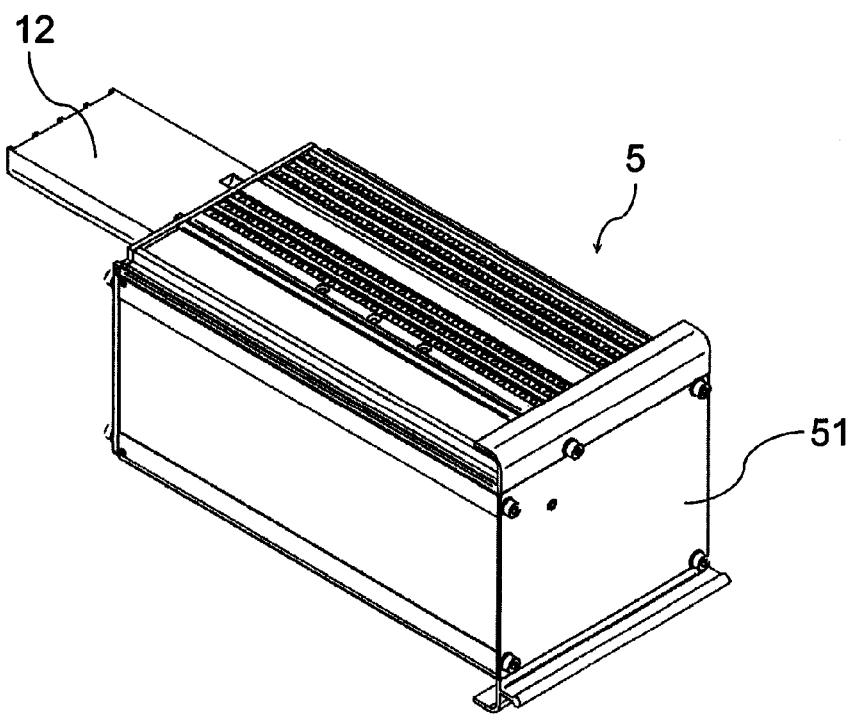
FIG. 8 shows a perspective view from the front side of the control module of FIG. 8.

The control modules 4, 5, one of which is shown in FIGS. 7 and 8, comprise second connectors 12 which in said coupling position of the frames 2, 3 are electrically interconnected, or are adapted to be electrically interconnected, to corresponding first connectors 11.

Preferably, in the coupling position between the two frames 2, 3 the first connectors 11 are positioned outside the seats 30 inside which modules 4, 5 are engaged.

Preferably, the control modules 5 comprise a a container body 50, comprising a front face 51 and a rear face 52. The container body 50 accommodates one or more circuit boards therein, for example input boards, output boards and processing boards. Such circuit boards may be intended both for signal processing and for conditioning such signals, for example in order to provide output signals of suitable power for the control and/or the supply of the railway field devices. To this end, it is possible to provide processing modules 4 between the control modules 4, 5 intended for signal processing and separate signal conditioning modules 5, each operatively interconnected to a respective processing module 4. The processing modules 4 are operatively interconnected to the central post and are such as to control the conditioning modules 5 so that they in turn control the railway field devices. Each pair consisting of a processing module 4 and of a respective conditioning module 5 represents a railway field device controller.

Figure 12:
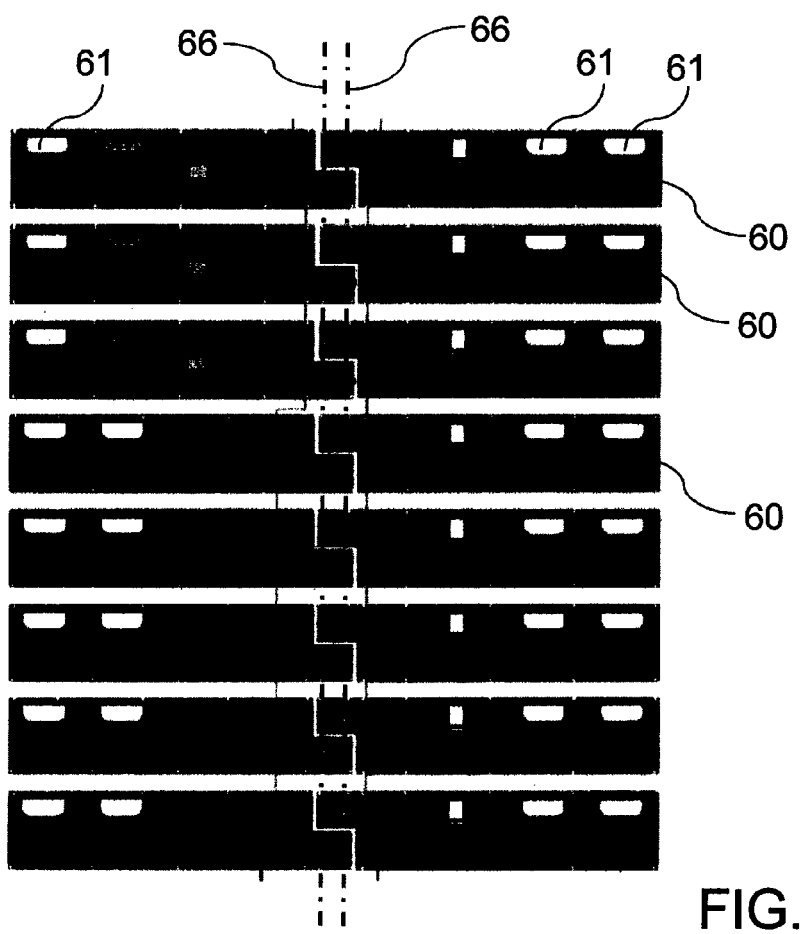
FIG. 12 shows a set of boards-buses of the support and containment frame of FIG. 1.

If there is a distinction of the type described above between the processing modules 4 and the conditioning modules 5, it is clear that it will be necessary to implement only the wiring of the conditioning modules 5 to the railway field devices. In this case, moreover, the processing modules 4 may be connected to the respective conditioning module 5 via a bus circuit board 60 placed at the bottom of seats 30, in the support and containment frame 3. To this end, both the processing modules 4 and the conditioning modules 5 comprise an interface connector 53 provided to implement the connection of the control modules 4, 5 to the board-bus. FIG. 12 shows by way of example sixteen bus circuit boards 60 arranged on eight rows. In the example shown, each bus board 60 is connectable to up to four control modules 4, 5, of which two processing modules 4 and two conditioning modules 5, for a total of eight modules per row. In the example shown in FIG. 1, the processing modules 4 occupy the four central seats in a row and the conditioning modules 5 the remaining lateral seats.

According to an embodiment, in the coupling position of frames 2, 3, the second connectors 12 project from the respective control modules 4, 5 to look out from the rear side 7 of the wiring frame 2. For this reason, at the positions in which the installation of the conditioning modules 5 is provided (if there is a distinction between processing modules 4 and conditioning modules 5) at least one opening 61 is defined within the bus circuit boards 60 (in the example two for each bus circuit board 60) adapted to be crossed by one of said second connectors 12.

According to a preferred embodiment, the support and containment frame 3 comprises at least one rigid supply bus bar 66 adapted to distribute the supply voltage to the control modules 4, 5. In the example shown in the figures, there are two bus bars 65 to which the bus circuit boards 60 are connected. In this case, therefore, the power is distributed from the supply bus bars to the control modules 4, 5 through bus circuit boards 60. According to an embodiment, base 25 includes an opening for the passage of the supply bus bars 66 or of electrical connection elements to said bus bars 66.

According to an embodiment, the wiring frame 2 comprises at least one attachment plate 20 of the first connectors 11 to which the first connectors 11 are mechanically coupled. The attachment plate 20 comprises openings 21 which in the coupling position between frames 2, 3 are crossed by respective second connectors 12. Such openings 21 are aligned with corresponding openings 61 provided in the bus circuit boards 60.

Figure 9:
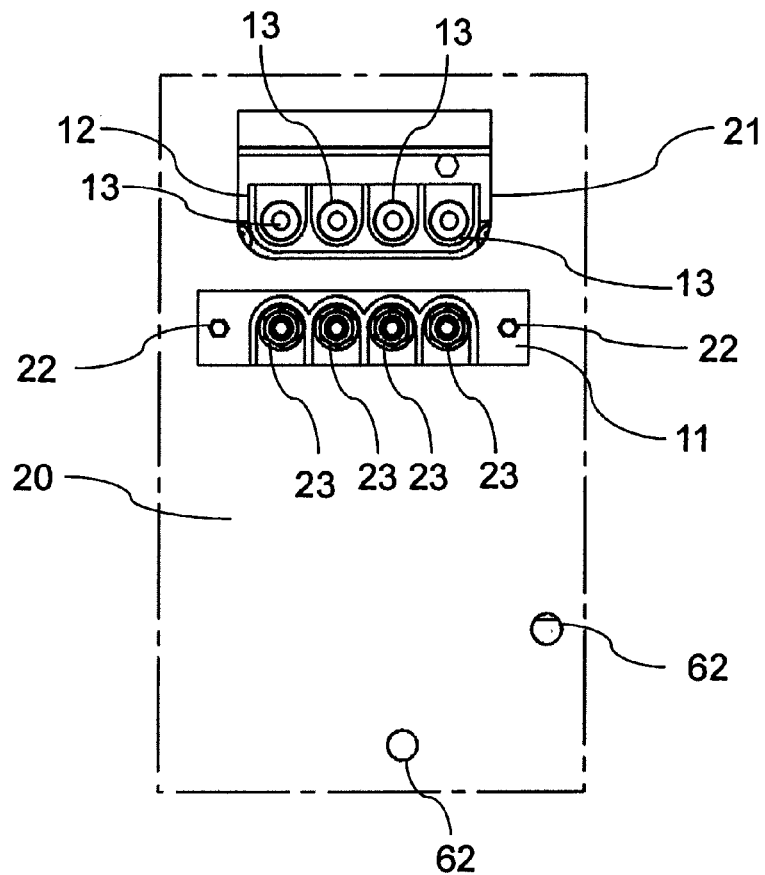
FIG. 9 shows a partial rear view of the rack of FIG. 1, wherein a first connector and a second connector of the rack of FIG. 1 are shown.

A first connector 11 and a second connector 12 are shown in FIG. 9 in the configuration taken by said connectors 11, 12 when the wiring frame 2 and the support and containment frame 3 are in the coupling position. In this figure, the first connector 11 is attached to the attachment plate 20 by a pair of screws 22 which cooperate with respective holes (not visible in the figures) provided in the attachment plate 20.

Going back to FIG. 9, according to an embodiment, in the coupling position between frames 2, 3 the first connectors 11 are vertically or horizontally aligned with respective second connectors 12. In the example of FIG. 9 it may be seen that the first connector 11 is vertically aligned with the second connector 12 and in the example with opening 21 too.

Figure 11:
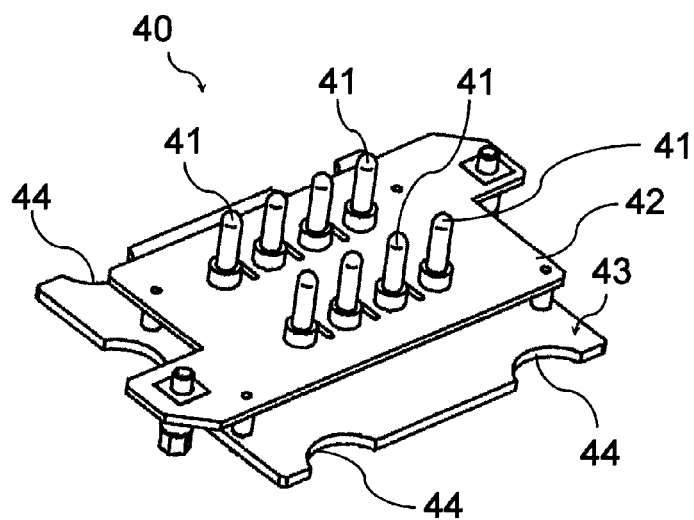
FIG. 11 shows a perspective view of the interconnection device of FIG. 10.

Again with reference to FIG. 9, preferably said first and second connector 11, 12 are multipolar connectors. For example, the first connector 11 comprises a body of electrically insulating material and a plurality of externally threaded conductive plugs 23 to which respective conductors 18 of the connection cables 8 to the field devices can be attached and electrically connected. For example, such conductors 18 are provided with eyelet connection terminals and can be keyed on the conductive plugs 23 and attached by means of one or more nuts screwed on the outer surface of the conductive plugs 23. The conductive plugs 23 are preferably hollow and preferably the second connector 12 is provided with an insulating body comprising a plurality of seats 23 within each of which there is an electrically conductive wall or connecting element. For the connection of the first connectors 11 to the corresponding second connectors 12, the use of bridge interconnection devices is preferably provided, for example, monopolar and in such case comprising each two conductive plugs which in the example in FIG. 9 are adapted to be fitted in seats 13 and in plugs 23, respectively. Multipolar connectors 40 such as connector 40 shown in FIGS. 10 and 11 may also be provided. With reference to FIG. 11, each multipolar connector 40 comprises a plurality of pairs of plugs 41 projecting from a support 42. According to an embodiment, support 42 comprises a circuit board to which plugs 41 are attached, provided with a noise suppression circuit. Preferably, the wiring frame 2 includes a conductive grounding bar 45 to which the circuit boards of the various supports 42 are connected. According to one embodiment, the multipolar connector 40 comprises a protective plate shield 43 attached to support 42 and comprising one or more ergonomic gripping elements, for example a plurality of manual gripping recesses.

With reference to FIGS. 9 and 10, according to an embodiment, the attachment plate 20 comprises elements, such as holes 62, for the attachment to plate 20, for example by means of screws 28, of a cable-retaining device 9, adapted to retain in a constrained manner an electrical cable 8 to the attachment plate 20.

The peripheral control post 1 above is remarkably easy to install. In fact, the wiring of the peripheral post to the field devices and also the verification of the connections may be carried out at the place of installation even in the absence of the support and containment frame 3 and/or the control modules 4, 5. The latter may be installed in the support and containment frame 3 and tested at the factory independently of the wiring to the railway field devices.

It is noted that the particular solution described is such as to minimise cable connections. It is noted that the presence of wheels in the wiring frame allows making the operations of transport, handling and installation particularly easy.

According to what described above, it is therefore possible to understand how a peripheral control post of the type described above allows achieving the objects mentioned above with reference to the prior art.

It is noted that the above description with reference to the peripheral control post also corresponds to the description of an installation method of the peripheral control post 1, comprising the steps of:
  installing the wiring frame 2;
  wiring the wiring frame 2 to the railway field devices;
  populating the support and containment frame 3 with a plurality of control modules 4, 5;
  drawing the support and containment frame 3 near the wiring frame 2 from the front side 6 thereof so as to reach the coupling position between the two frames 2, 3.

Preferably, the above steps of installing and wiring are performed before said step of drawing near.

The principle of the invention being understood, the manufacturing details and the embodiments may widely vary compared to what described and illustrated by way of a non-limiting example only, without departing from the scope of the invention as defined in the accompanying claims.

The invention claimed is:

1. Peripheral control post of railway field devices, comprising:
  a plurality of control modules operatively connected or connectable by electric cables to respective railway field devices;
  rack housing said plurality of control modules; wherein the rack comprises:
    a wiring frame adapted to be stably attached to a support surface or to an installation wall, having a front face and an opposite rear face and comprising a plurality of first connectors extending from the rear face of the wiring frame and adapted to be electrically connected to end portions of said cables; and
    a support and containment frame of the modules adapted to house said modules and adapted to be coupled to the wiring frame by drawing the support and containment frame near the wiring frame from said front face so as to reach a coupling position, the support and containment frame comprising a plurality of seats inside which said modules are engaged;
  wherein the control modules comprise second connectors which in said coupling position of the frames are electrically interconnected, or are adapted to be electrically interconnected, to corresponding first connectors; in said coupling position of the frames the second connectors project from the respective control modules and through the wiring frame so as to face from the rear face of the wiring frame and so that the second connectors are, or can be, electrically interconnected to corresponding first connectors on the rear face of the wiring frame.

2. Peripheral control post according to claim 1, wherein the wiring frame comprises at least one attachment plate of said first connectors to which said first connectors are mechanically coupled, wherein said plate comprises openings which in said coupling position are crossed by respective second connectors.

3. Peripheral control post according to claim 1, comprising at least one bridge interconnection device adapted to interconnect one of said first connectors to the corresponding second connector.

4. Peripheral control post according to claim 1, wherein in the coupling position the first connectors are vertically or horizontally aligned with respective second connectors.

5. Peripheral control post according to claim 4, wherein said base comprises stop elements adapted to define said coupling position.

6. Peripheral control post according to claim 5, wherein said stop elements comprise recesses adapted to receive at least partially said wheels.

7. Peripheral control post according to claim 1, wherein the wiring frame comprises at least one upright and a base to which said upright is attached and which projects in relation to said upright from the front face and wherein in said coupling position the support and containment frame is superposed to said base.

8. Peripheral control post according to claim 1, wherein the support and containment frame of the modules is provided underneath with a plurality of wheels.

9. Peripheral control post according to claim 1, wherein the control modules comprise at least one processing module and at least one conditioning module operatively connected to each other by a bus circuit board positioned at the bottom of said seats in said support rack, inside said bus circuit board an opening being defined, in which said conditioning module comprises one of said second connectors-which projects from a rear face of said conditioning module to cross said opening.

10. Peripheral control post according to claim 1, wherein in the coupling position between the two frames the first connectors are positioned outside the seats inside which the modules are engaged.

11. Peripheral control post according to claim 1, wherein the support and containment frame is a rack structure adapted to contain and support inside the seats the control modules.

12. Railway interlocking and/or signalling system comprising a central control post and a plurality of peripheral control posts according to claim 1 connected to said central post.

13. Installation method of a peripheral control post according to claim 12, wherein said steps of installing and wiring are performed before said step of drawing near.

14. Installation method of a peripheral control post according to claim 1 comprising the steps of:
   installing said wiring frame;
   wiring the wiring frame to said railway field devices on a rear face of the wiring frame;
   populating the support and containment frame with a plurality of control modules;
   drawing the support and containment frame near the wiring frame from a front face of the wiring frame so as to reach said coupling position, wherein in said coupling position connectors of the control modules project from the respective control modules and through the wiring frame so as to face from the rear face of the wiring frame;
   connecting the first connectors with the second connectors on the rear face of the wiring frame.

* * * * *